(12) United States Patent
Choi et al.

(10) Patent No.: US 9,059,046 B2
(45) Date of Patent: Jun. 16, 2015

(54) THIN FILM TRANSISTOR, THIN FILM TRANSISTOR ARRAY PANEL, AND METHOD OF MANUFACTURING A THIN FILM TRANSISTOR ARRAY PANEL

(75) Inventors: Shin Il Choi, Hwaseong-si (KR); Seung-Ha Choi, Suwon-si (KR); Bong-Kyun Kim, Hwaseong-si (KR); Sang Gab Kim, Seoul (KR); Sho Yeon Kim, Yongin-si (KR); Hyun Kim, Gunpo-si (KR); Hong Sick Park, Suwon-si (KR); Su Bin Bae, Gyeongsan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 34 days.

(21) Appl. No.: 13/612,590

(22) Filed: Sep. 12, 2012

(65) Prior Publication Data
US 2013/0277666 A1 Oct. 24, 2013

(30) Foreign Application Priority Data
Apr. 18, 2012 (KR) .................. 10-2012-0040502

(51) Int. Cl.
*H01L 29/10* (2006.01)
*H01L 29/12* (2006.01)
*H01L 27/12* (2006.01)

(52) U.S. Cl.
CPC .................. *H01L 27/1225* (2013.01)

(58) Field of Classification Search
CPC .................. H01L 29/7869; H01L 27/1225
USPC .................................................. 257/43
See application file for complete search history.

(56) References Cited

U.S. PATENT DOCUMENTS

| | | | |
|---|---|---|---|
| 6,310,667 B1 * | 10/2001 | Nakayoshi et al. | 349/42 |
| 6,819,383 B2 * | 11/2004 | Chae et al. | 349/140 |
| 7,776,662 B2 * | 8/2010 | Wang et al. | 438/149 |
| 8,077,268 B2 * | 12/2011 | Lee et al. | 349/43 |
| 8,236,628 B2 * | 8/2012 | Liu et al. | 438/149 |
| 2007/0176868 A1 | 8/2007 | Lee et al. | |
| 2007/0235737 A1 * | 10/2007 | Ahn et al. | 257/59 |

(Continued)

FOREIGN PATENT DOCUMENTS

| JP | 2010-062543 A | 3/2010 |
|---|---|---|
| JP | 2010-114432 A | 5/2010 |

(Continued)

*Primary Examiner* — William D Coleman
(74) *Attorney, Agent, or Firm* — Innovation Counsel LLP

(57) ABSTRACT

A thin film transistor array panel according to an exemplary embodiment of the invention includes: a substrate; a gate line positioned on the substrate and including a gate electrode; a gate insulating layer positioned on the gate line; an oxide semiconductor layer positioned on the substrate; a source electrode and a drain electrode positioned on the oxide semiconductor layer; a first insulating layer positioned on the source electrode and the drain electrode and including a first contact hole; a data line positioned on the first insulating layer and intersecting the gate line; and a pixel electrode over the first insulating layer. The source electrode and the drain electrode each comprise a metal oxide. The data line is electrically connected to the source electrode through the first contact hole.

26 Claims, 16 Drawing Sheets

(56) References Cited

U.S. PATENT DOCUMENTS

| | | | |
|---|---|---|---|
| 2009/0040408 A1* | 2/2009 | Ishii | 349/39 |
| 2010/0001346 A1 | 1/2010 | Ye | |
| 2010/0065842 A1 | 3/2010 | Yamazaki et al. | |
| 2010/0084649 A1 | 4/2010 | Seo et al. | |
| 2011/0115763 A1 | 5/2011 | Yamazaki et al. | |
| 2011/0163309 A1* | 7/2011 | Choi et al. | 257/43 |
| 2012/0120362 A1* | 5/2012 | Choi et al. | 349/140 |
| 2013/0087800 A1* | 4/2013 | Hong et al. | 257/72 |
| 2013/0271690 A1* | 10/2013 | Matsukizono | 349/46 |

FOREIGN PATENT DOCUMENTS

| | | |
|---|---|---|
| JP | 2010-135773 A | 6/2010 |
| JP | 2011-216694 A | 10/2011 |
| KR | 1020090076581 A | 7/2009 |
| KR | 1020100038181 A | 4/2010 |
| KR | 1020110109885 A | 10/2011 |
| KR | 1020110125105 A | 11/2011 |

\* cited by examiner

THIN FILM TRANSISTOR, THIN FILM TRANSISTOR ARRAY PANEL, AND METHOD OF MANUFACTURING A THIN FILM TRANSISTOR ARRAY PANEL

CROSS-REFERENCE TO RELATED APPLICATION

This application claims priority to, and the benefit of, Korean Patent Application No. 10-2012-0040502 filed in the Korean Intellectual Property Office on Apr. 18, 2012, the entire contents of which are incorporated herein by reference.

BACKGROUND OF THE INVENTION (a) Field of the Invention

Embodiments of the present invention relate generally to a thin film transistor, a thin film transistor array panel, and a manufacturing method thereof.

(b) Description of the Related Art

In general, flat panel displays such as liquid crystal displays, organic light emitting diode displays, or the like include a plurality of pairs of field generating electrodes and an electro-optical active layer interposed therebetween. The liquid crystal display includes a liquid crystal layer as its electro-optical active layer, and the organic light emitting diode display includes an organic emission layer as its electro-optical active layer.

One of a pair of field generating electrodes is generally connected to a switching element to receive an electric signal, and the electro-optical active layer converts the electric signal into an optical signal, thereby displaying an image.

In flat panel displays, a thin film transistor (TFT), which is a three-terminal element, is used as the switching element, and signal lines including a gate line transferring a scanning signal for controlling the thin film transistor, a data line transferring a signal applied to a pixel electrode, and the like are included in the flat panel display.

As the visible area of the display device grows, in order to implement high-speed driving, an oxide semiconductor technology and a method of reducing resistance in signal lines has been examined. Particularly, to reduce the resistance of the signal line, a main wiring layer may be formed of copper, a copper alloy, molybdenum, or a molybdenum alloy. However, electrical characteristics of the thin film transistor may be compromised by interaction between the main wiring layer of the metal and the oxide semiconductor, and/or a reaction with other layers.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a thin film transistor having a terminal formed of a metal oxide, a thin film transistor array panel, and a manufacturing method therefor.

A thin film transistor array panel according to an exemplary embodiment of the present invention includes: a substrate; a gate line positioned on the substrate and including a gate electrode; a gate insulating layer positioned on the gate line; an oxide semiconductor layer positioned on the substrate; a source electrode and a drain electrode positioned on the oxide semiconductor layer; a first insulating layer positioned on the source electrode and the drain electrode and including a first contact hole; a data line positioned on the first insulating layer and intersecting the gate line; and a pixel electrode over the first insulating layer. The source electrode and the drain electrode each comprise a metal oxide, and the data line is electrically connected to the source electrode through the first contact hole.

An upper surface of a portion of the source electrode and the drain electrode overlapping the gate electrode may contact the first insulating layer.

A second insulating layer may be positioned on the data line, and a connection connecting the data line and the source electrode on the second insulating layer may be further included.

The connection may contact the data line and the source electrode in the first contact hole.

The second insulating layer may include a second contact hole, the pixel electrode may be connected to the drain electrode through the second contact hole, and the pixel electrode may be positioned at the same layer as the connection.

The data line may directly contact the source electrode in the first contact hole.

The data line may include a protrusion protruding toward the gate electrode, and the protrusion may overlap the first contact hole.

The pixel electrode may be connected to the drain electrode through the second contact hole.

The source electrode and the drain electrode may each contact the oxide semiconductor layer.

The source electrode and the drain electrode may each comprise a metal oxide including at least one of indium, gallium, zinc, tin, and aluminum.

A method of manufacturing a thin film transistor array panel according to an exemplary embodiment of the present invention includes: forming a gate line on a substrate, the gate line including a gate electrode; forming a gate insulating layer on the gate line; forming an oxide semiconductor layer on the substrate; forming a source electrode and a drain electrode on the oxide semiconductor layer; forming a first insulating layer on the source electrode and the drain electrode, the first insulating layer including a first contact hole; forming a data line on the first insulating layer, the data line intersecting the gate line; and forming a pixel electrode on the second insulating layer, wherein the source electrode and the drain electrode each comprise a metal oxide, and the data line is electrically connected to the source electrode through the first contact hole.

An upper surface of a portion of the source electrode and the drain electrode overlapping the gate electrode may contact the first insulating layer.

The method may further include forming a second insulating layer on the data line, and forming a connection connecting the data line and the source electrode on the second insulating layer.

The connection may simultaneously contact the data line and the source electrode in the first contact hole.

The second insulating layer may include a second contact hole, and the pixel electrode may be connected to the drain electrode through the second contact hole.

The pixel electrode and the connection may be formed at the same layer.

The data line and the source electrode may directly contact in the first contact hole.

The data line may include a protrusion protruding toward the gate electrode, and the protrusion may overlap the first contact hole.

The pixel electrode may be connected to the drain electrode through the second contact hole.

The source electrode and the drain electrode may contact the oxide semiconductor layer.

A thin film transistor according to an exemplary embodiment of the present invention includes: a substrate; a gate electrode positioned on the substrate; a gate insulating layer positioned on the gate electrode; an oxide semiconductor layer positioned on the substrate; a source electrode and a drain electrode positioned on the oxide semiconductor layer; and a passivation layer positioned on the source electrode and the drain electrode, wherein the source electrode and the drain electrode are formed of a metal oxide, and upper surfaces of portions of the source electrode and the drain electrode overlapping the gate electrode contact the passivation layer.

The source electrode and the drain electrode may contact the oxide semiconductor layer.

The source electrode and the drain electrode may comprise a metal oxide including at least one of indium, gallium, zinc, tin, and aluminum.

The source electrode and the drain electrode may include a lower layer and an upper layer positioned on the lower layer.

According to an exemplary embodiment of the present invention, by forming the source electrode and the drain electrode including a metal oxide, the characteristic of the thin film transistor may be improved. Also, the main signal line transmitting the signal is formed of a material having low resistance, and is separated from the source electrode and the drain electrode such that RC delay may be prevented.

DETAILED DESCRIPTION OF THE EMBODIMENTS

Figure 1:
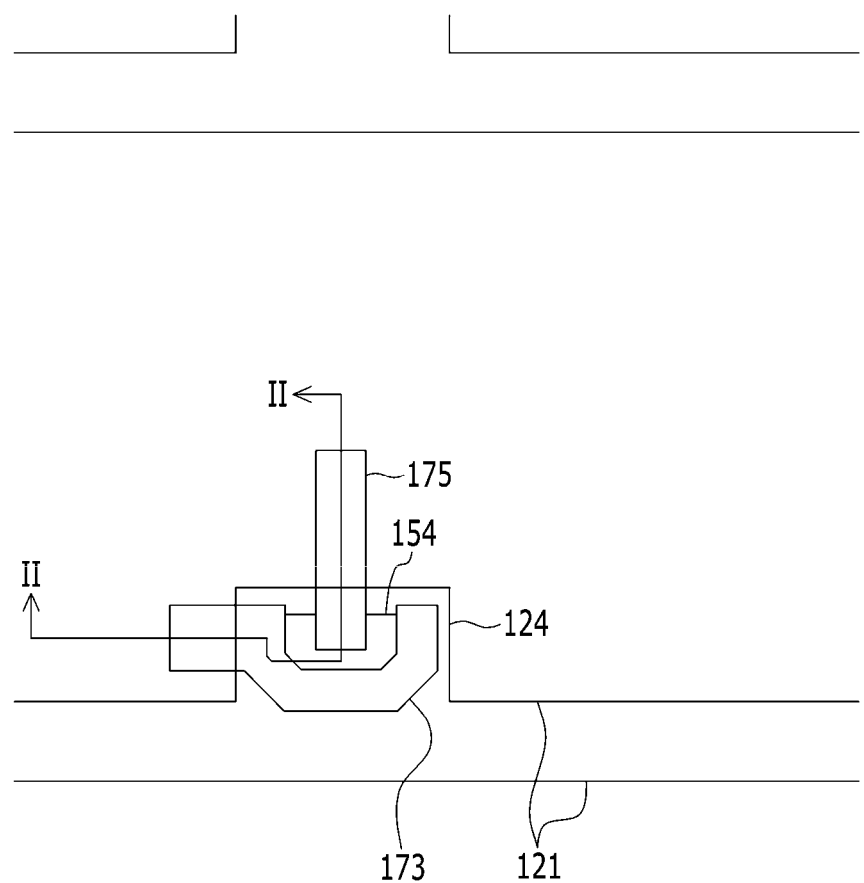
FIG. 1 to FIG. 8 are plane views and cross-sectional views of a manufacturing method for a thin film transistor array panel according to an exemplary embodiment of the present invention.

The present invention will be described more fully hereinafter with reference to the accompanying drawings, in which exemplary embodiments of the invention are shown. However, it is to be understood that the invention is not limited to the disclosed embodiments, but, on the contrary, is intended to cover various modifications. As those skilled in the art would realize, the described embodiments may be modified in various different ways, all without departing from the spirit or scope of the present invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. Like reference numerals designate like elements throughout the specification.

Figure 2:
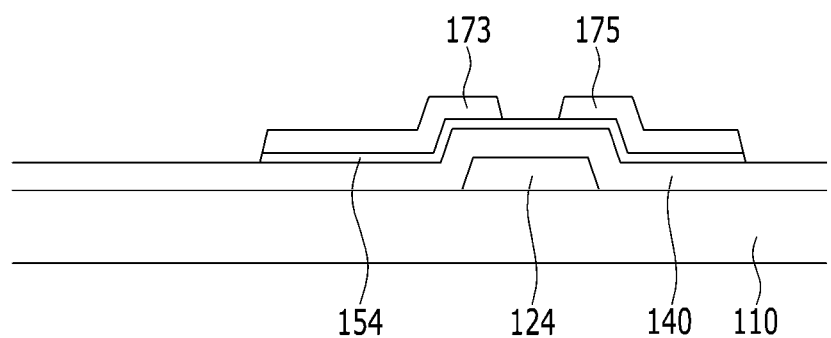
Figure 3:
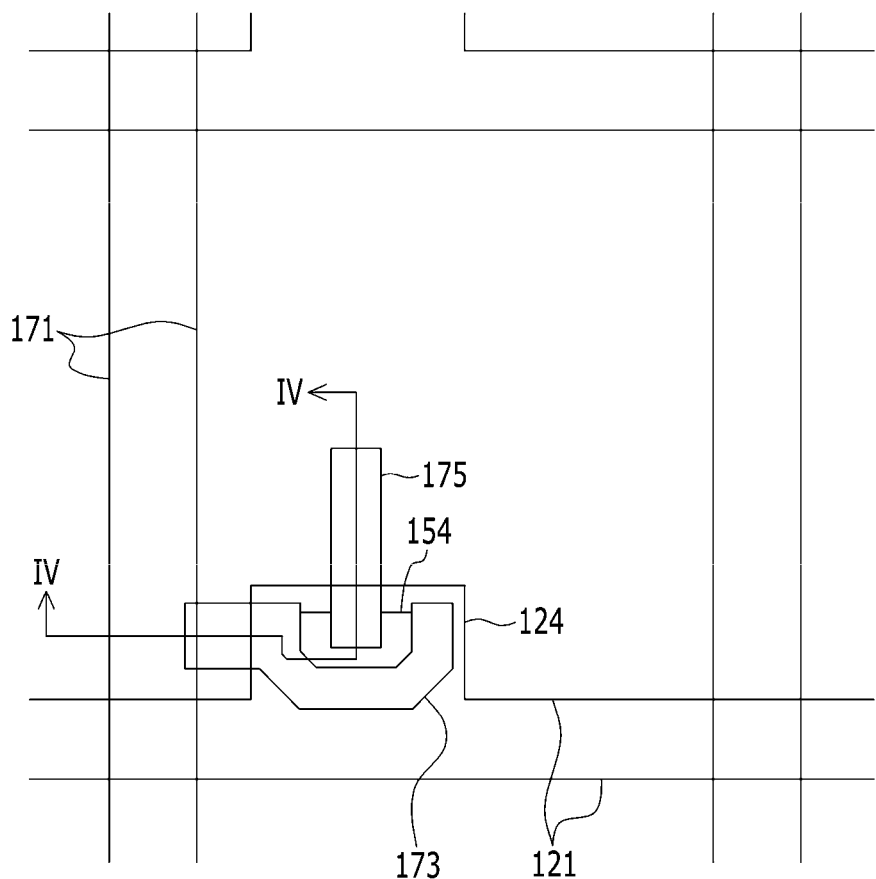
Figure 4:
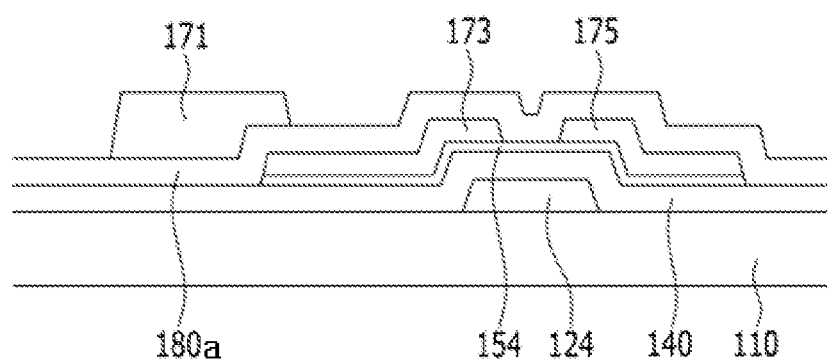
Figure 5:
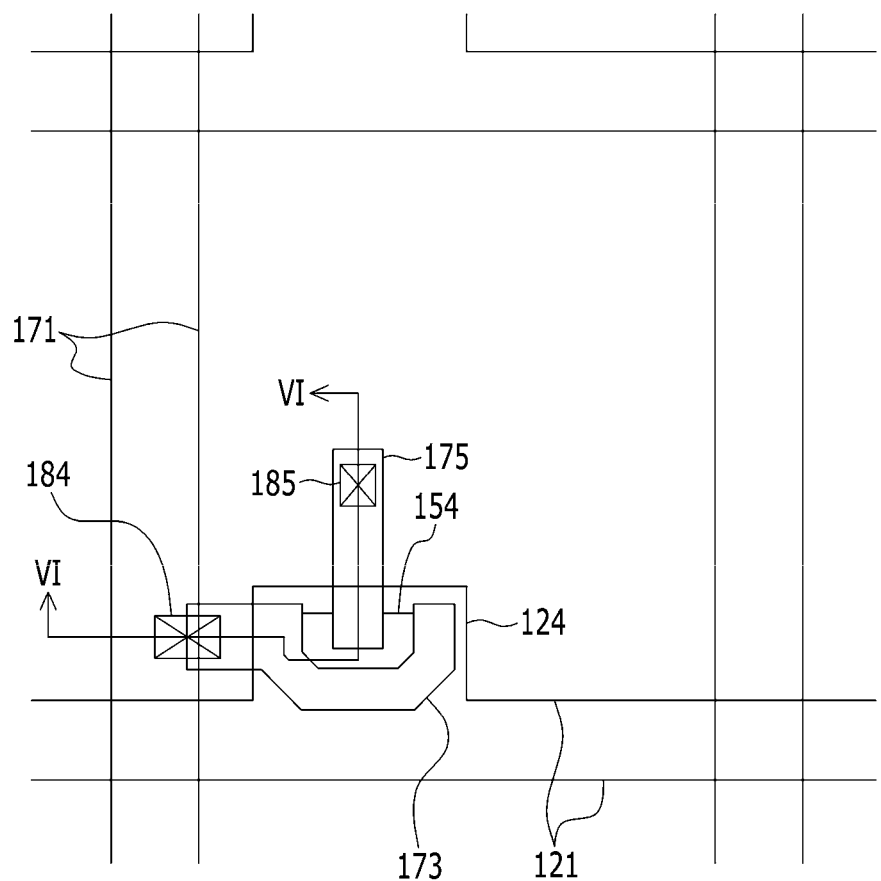
Figure 6:
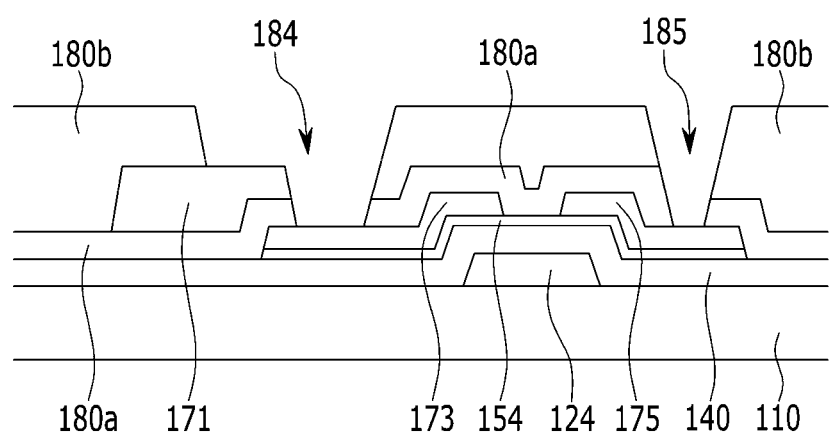
Figure 7:
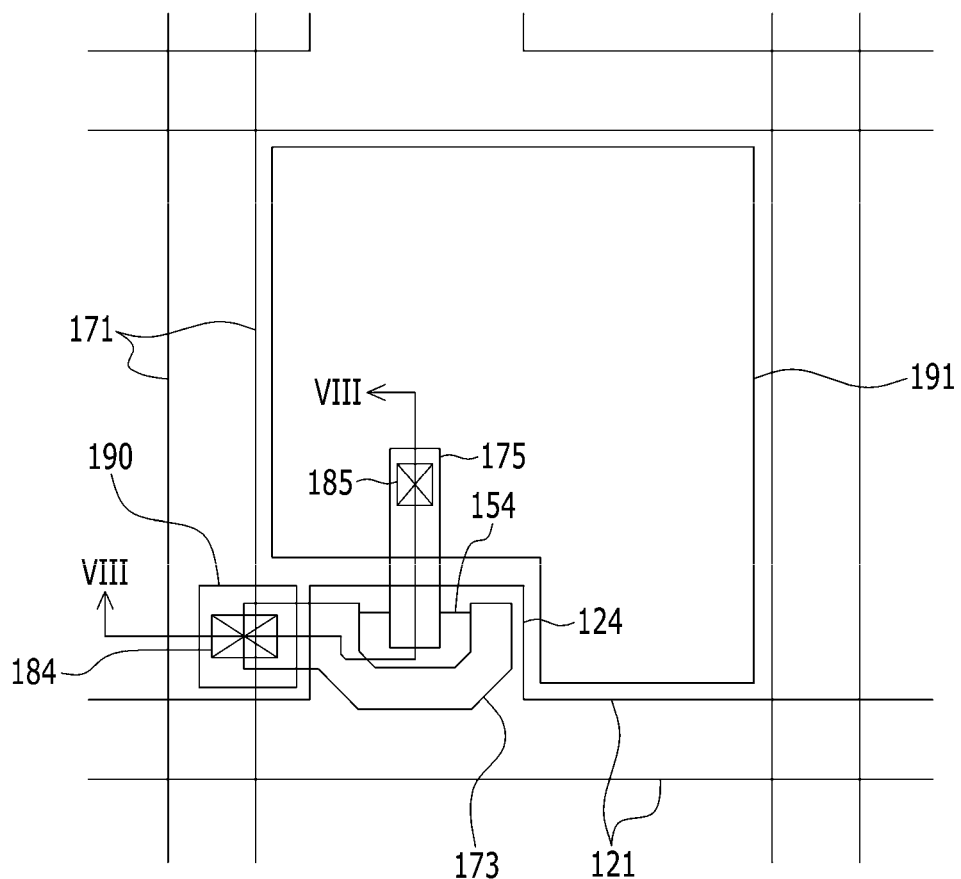
Figure 8:
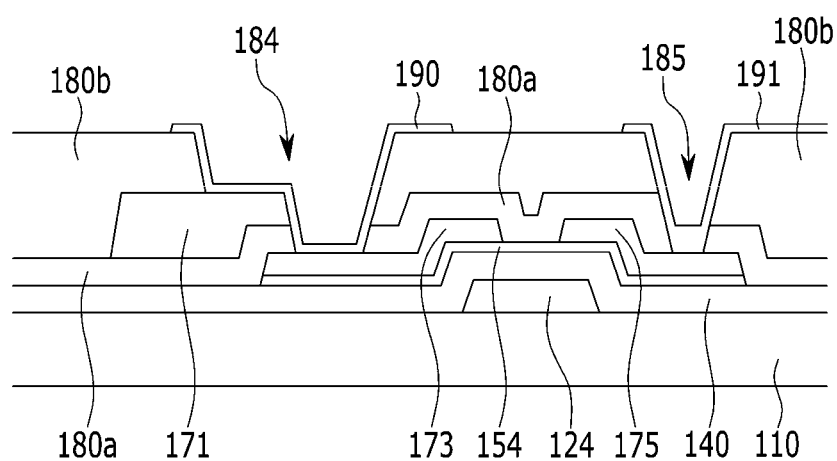

FIG. 1 to FIG. 8 are plane views and cross-sectional views of a method of manufacturing a thin film transistor array panel according to an exemplary embodiment of the present invention. FIG. 2 is a cross-sectional view taken along the line II-II of FIG. 1. FIG. 4 is a cross-sectional view taken along the line IV-IV of FIG. 3, FIG. 6 is a cross-sectional view taken along the line VI-VI of FIG. 5, and FIG. 8 is a cross-sectional view taken along the line VIII-VIII of FIG. 7.

Referring to FIG. 1 and FIG. 2, a plurality of gate lines 121 transmitting a gate signal and extending in a transverse direction are formed on a substrate 110. The gate lines 121 are formed to include a plurality of gate electrodes 124 protruding from the gate lines 121, as shown.

The gate lines 121 and the gate electrodes 124 may be made of an aluminum-based metal such as aluminum (Al), an aluminum alloy, and the like, a silver-based metal such as silver (Ag), a silver alloy, and the like, a copper-based metal such as copper (Cu), a copper alloy, and the like, a molybdenum-based metal such as molybdenum (Mo), a molybdenum alloy, and the like, and/or chromium (Cr), titanium (Ti), tantalum (Ta), manganese (Mn), and the like, respectively. Any other suitable material is also contemplated.

In the exemplary embodiment, the gate lines 121 and gate electrodes 124 are formed as a single layer, but the configurations of various embodiments are not limited thereto, and they may also be formed as a multilayer structure such as double layer or triple layer structure.

A gate insulating layer 140, made of an insulating material such as silicon oxide or silicon nitride, is formed on the gate line 121. In the present exemplary embodiment, the gate insulating layer 140 is formed of a single layer. However, the gate insulating layer 140 may also include multiple layers such as a lower layer of silicon nitride (SiNx) or silicon oxynitride (SiON) and an upper layer made of silicon oxide (SiO2).

A plurality of semiconductor layers 154 each made of an oxide semiconductor, and a plurality of source electrodes 173 and a plurality of drain electrodes 175 are formed on the gate insulating layer 140. The semiconductor layer 154 is formed with an island shape at a portion corresponding to the gate electrode 124. The semiconductor layer 154 also includes at least one among zinc (Zn), indium (In), tin (Sn), gallium (Ga), and hafnium (Hf). Particularly, in the present exemplary embodiment, the semiconductor layer 154 may be indium-gallium-zinc oxide. The source electrode 173 and the drain electrode 175 are formed of a metal oxide. The metal oxide forming the source electrode 173 and the drain electrode 175 includes at least one of indium, gallium, zinc, tin, and aluminum.

Next, a method of forming the semiconductor layer 154, the source electrode 173, and the drain electrode 175 will be described in further detail.

An oxide semiconductor material layer and a source/drain material layer are sequentially deposited on the gate insulating layer 140, and a photosensitive film pattern (not shown) is formed on the source/drain material layer. The photosensitive film pattern includes a first region corresponding to a position where the source electrode 173 and the drain electrode 175 will be formed, and a second region corresponding to a position where the channel region of the thin film transistor will be formed. The second region is formed to be thinner than the first region. A thickness difference of the photosensitive film pattern may be formed by controlling an irradiating light amount by using a mask, or may be formed by using a reflow method. In the case where the light amount is controlled, a slit pattern, a lattice pattern, or a semi-transparent layer may be formed on the mask.

The source/drain material layer and the oxide semiconductor material layer are etched by using the photosensitive film pattern as a mask to remove those parts of the source/drain material layer and the oxide semiconductor material layer that are positioned outside the gate electrode 124 and that are not covered by the photosensitive film pattern, thereby forming a source electrode and drain electrode pattern with the abovementioned island shape.

By removing the thinner second region by etching back the photosensitive film pattern, the source electrode and drain electrode pattern (which helps determine where the channel region will be formed) is exposed. Next, the exposed source electrode pattern and drain electrode pattern are etched to form the semiconductor layer 154 including the channel region, and the source electrode 173 and the drain electrode 175.

At this time, the etchant used may be one that is capable of etching the source/drain material layer without etching the oxide semiconductor material layer, thereby performing a selective etching process.

The source electrode 173 may be formed to overlap the gate electrode 124 and to have a roughly U-shaped configuration. The drain electrode 175 faces the source electrode 173 with respect to the gate electrode 124, and may be formed with a shape extending into the U shape of the source electrode 173, i.e. the drain electrode 175 extends between two portions of the source electrode 173, or the source electrode 173 at least partially surrounds one end of the drain electrode 175. This structure of the source electrode 173 and the drain electrode 175 is only one example, and may take on various shapes and configurations.

The oxide semiconductor layer 154 includes an exposed portion that is not covered by either the source electrode 173 or the drain electrode 175, and lies between the source electrode 173 and the drain electrode 175. The oxide semiconductor layer 154 may have a substantially same plane pattern as the source electrode 173 and the drain electrode 175, excepting the exposed portion of the oxide semiconductor layer 154.

One gate electrode 124, one source electrode 173, and one drain electrode 175 collectively form one thin film transistor (TFT) along with the corresponding oxide semiconductor layer 154, and the channel of the thin film transistor is formed between the source electrode 173 and the drain electrode 175.

Referring to FIG. 3 and FIG. 4, a lower passivation layer 180a covering the source electrode 173, the drain electrode 175, and the exposed portion of the oxide semiconductor layer 154 is formed on the gate insulating layer 140. The lower passivation layer 180a is formed of an inorganic insulator such as silicon nitride or silicon oxide, an organic insulator, or a lower dielectric constant insulating material.

Next, a plurality of data lines 171 transmitting a data signal and extending in a longitudinal direction (thereby intersecting the gate lines 121) are formed on the lower passivation layer 180a. The data lines 171 may be made of a material such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), and/or titanium (Ti). For example, Mo—Nb and Mo—Ti can be used for the molybdenum alloy. Also, the source electrode 173 and the drain electrode 175 may be made of a transparent conductive material such as ITO, IZO, and AZO. The source electrode 173 and the drain electrode 175 may be made of a multilayer structure including at least two conductive layers (not shown). For example, Mo/Al/Mo, Mo/Al, Mo/Cu, CuMn/Cu, and Ti/Cu can be used.

Referring to FIG. 5 and FIG. 6, an upper passivation material layer is deposited to cover the lower passivation layer 180a and the data line 171. Next, the upper passivation material layer is patterned to form an upper passivation layer 180b having a first contact hole 184 exposing a portion of the data line 171 and the source electrode 173, as well as a second contact hole 185 exposing a portion of the drain electrode 175. Here, in the process of forming the first contact hole 184 and the second contact hole 185, the lower passivation layer 180a is also patterned along with the upper passivation layer 180b, thereby forming the first contact hole 184 and the second contact hole 185.

The upper passivation layer 180b is made of an inorganic insulator such as silicon nitride or silicon oxide, an organic insulator, or a low dielectric constant insulating material.

Referring to FIG. 7 and FIG. 8, a conductive material layer is formed on the upper passivation layer 180b, so as to also be deposited into the first contact hole 184 and the second contact hole 185. Next, the conductive material layer is patterned to form a connection 190 contacting the data line 171 and the source electrode 173 in the first contact hole 184, and a pixel electrode 191 contacting the drain electrode 175 inside the second contact hole 185. The connection 190 and the pixel electrode 191 are formed by patterning the same conductive material layer such that they are positioned at the same level, or in the same layer.

Here, the connection 190 is electrically connected to the data line 171 and the source electrode 173, and the pixel electrode 191 is physically and electrically connected to the drain electrode 175 through the second contact hole 185, thereby receiving the data voltage from the drain electrode 175.

The connection 190 and the pixel electrode 191 may be made of a transparent conductor such as ITO or IZO.

Figure 9:
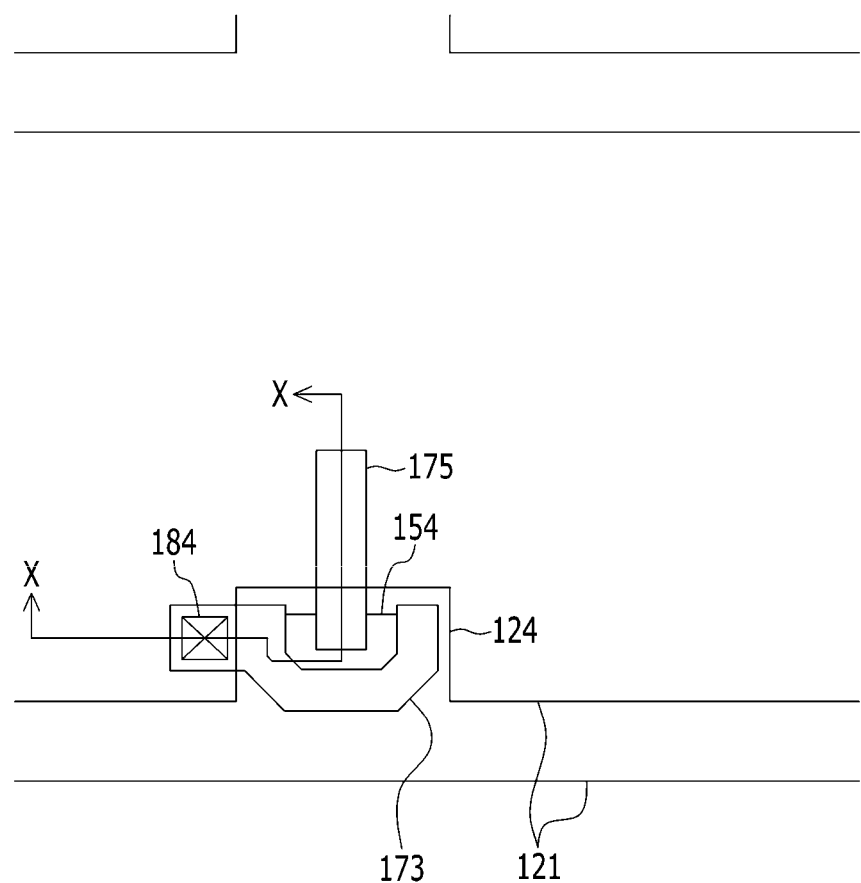
FIG. 9 to FIG. 14 are plane views and cross-sectional views of a manufacturing method for a thin film transistor array panel according to an exemplary embodiment of the present invention.
Figure 10:
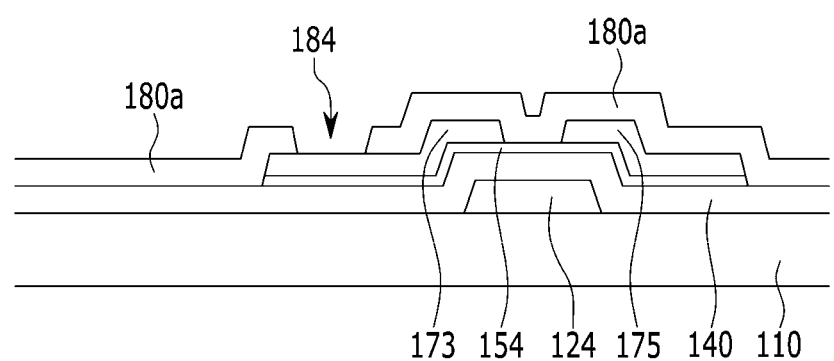
Figure 11:
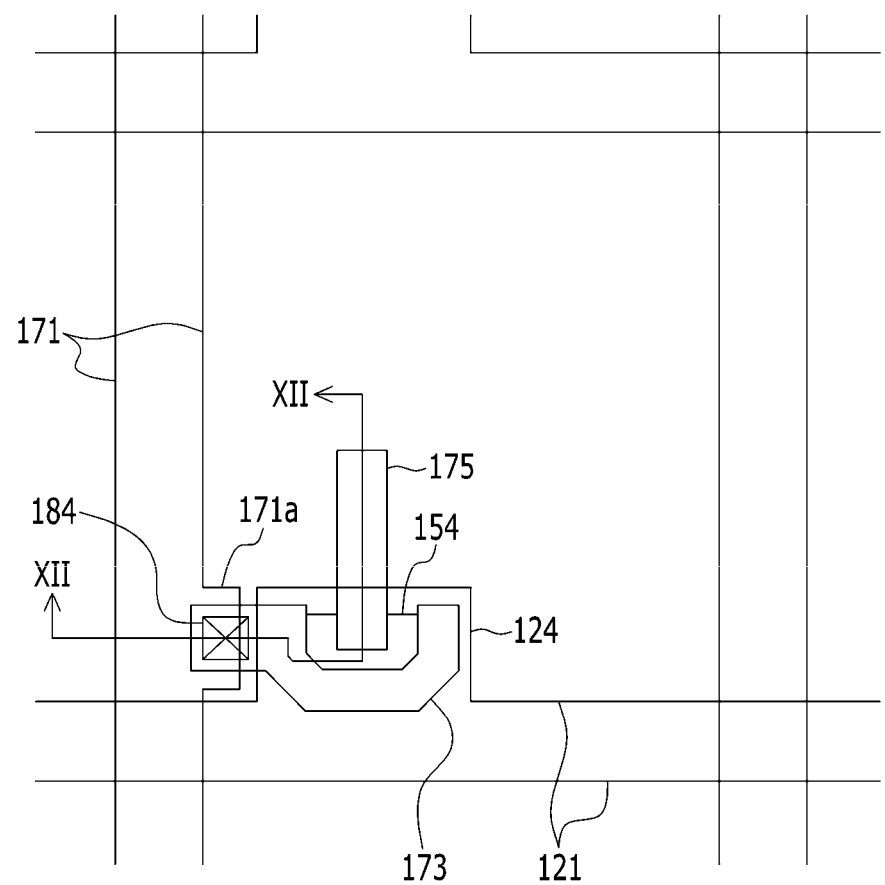
Figure 12:
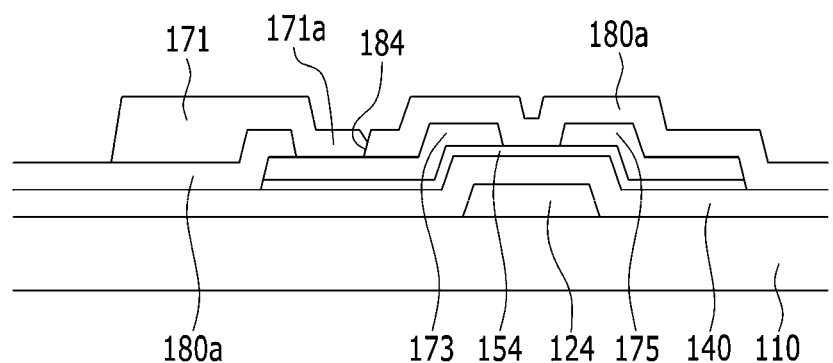
Figure 13:
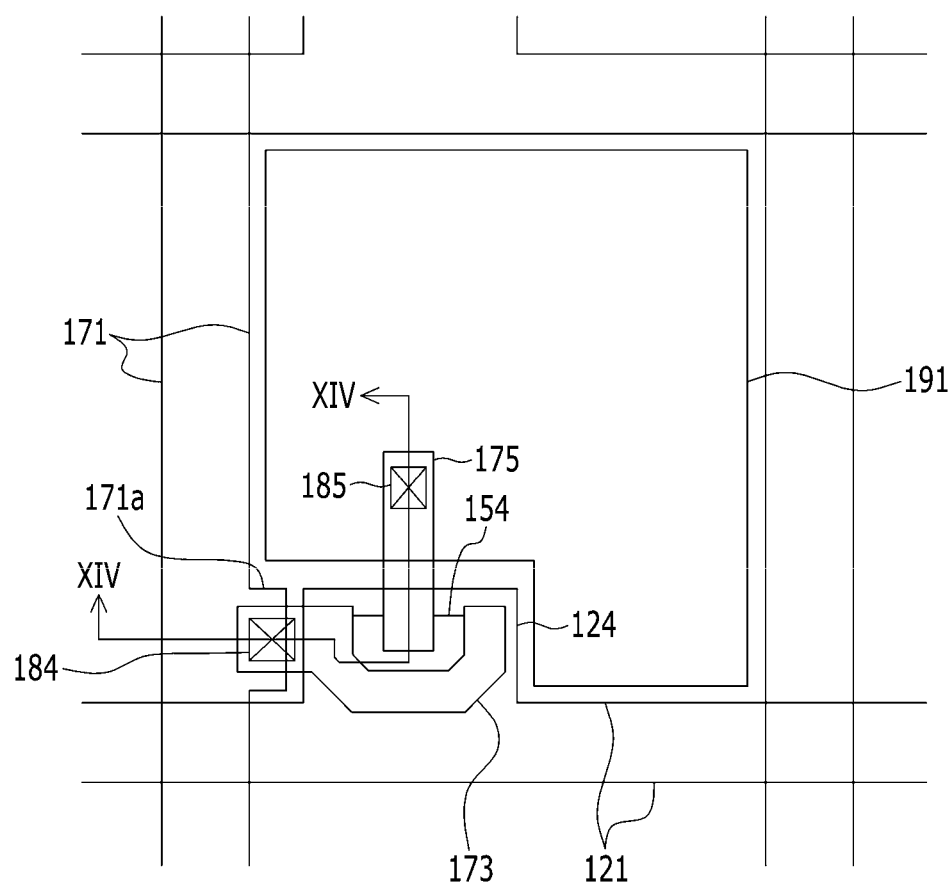
Figure 14:
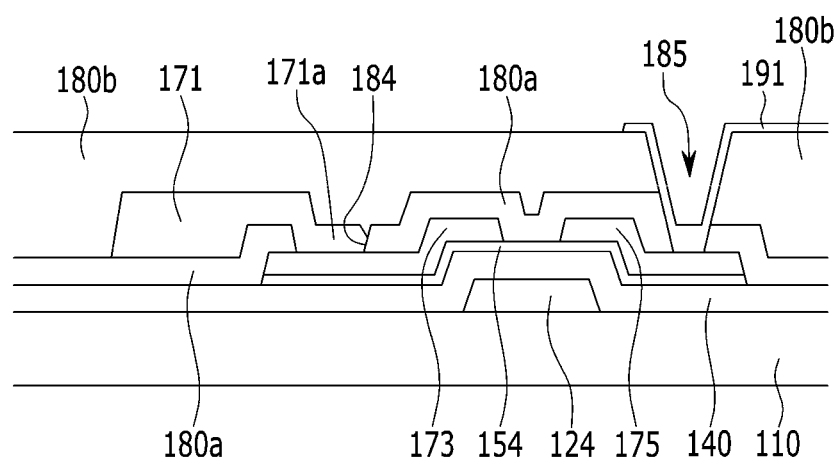

FIG. 9 to FIG. 14 are plane views and cross-sectional views of a method of manufacturing a thin film transistor array panel according to an exemplary embodiment of the present invention. FIG. 10 is a cross-sectional view taken along the line X-X of FIG. 9, FIG. 12 is a cross-sectional view taken along the line XII-XII of FIG. 11, and FIG. 14 is a cross-sectional view taken along the line XIV-XIV of FIG. 13.

In the present exemplary embodiment, the same processes as those described with reference to FIG. 1 and FIG. 2 are performed. Next, the process of the present exemplary embodiment is the same as the above exemplary embodiment, until the forming of the lower passivation layer 180a covering the source electrode 173, the drain electrode 175, and the exposed portion of the oxide semiconductor layer 154 on the gate insulating layer 140. Subsequently, differences from the exemplary embodiment described with reference to FIG. 1 to FIG. 8 will be described.

Referring to FIG. 9 and FIG. 10, the lower passivation layer 180a is patterned to form the first contact hole 184 exposing a portion of the source electrode 173.

Referring to FIG. 11 and FIG. 12, a metal material layer is deposited on the lower passivation layer 180a and patterned to form a plurality of data lines 171 extending in the longitudinal direction thereby intersecting the gate lines 121. The data line 171 is formed to directly contact the source electrode 173 in the first contact hole 184. As shown in FIG. 11, in one exemplary embodiment, a protrusion 171a extending in the longitudinal direction from the data line 171 is formed, and the protrusion 171a may be formed to directly contact the source electrode 173 through the first contact hole 184. That is, the protrusion 171a has a portion overlapping the first contact hole 184.

Referring to FIG. 13 and FIG. 14, an upper passivation material layer is deposited to cover the data line 171 and the lower passivation layer 180a. The upper passivation material layer is patterned to form an upper passivation layer 180b having second contact hole 185.

A conductive material layer is deposited on the upper passivation layer 180b, and is patterned to form pixel electrode 191 contacting the drain electrode 175 in the second contact hole 185.

Here, the pixel electrode 191 is physically and electrically connected to the drain electrode 175 through the second contact hole 185, thereby receiving the data voltage from the drain electrode 175.

Again referring to FIG. 7 and FIG. 8, a thin film transistor array panel according to an exemplary embodiment of the present invention will be described.

The thin film transistor array panel according to the present exemplary embodiment includes a substrate 110, a gate line 121 positioned on the substrate and including a gate electrode 124, a gate insulating layer 140 positioned on the gate line 121, an oxide semiconductor layer 154 positioned on the gate insulating layer 140, and a source electrode 173 and a drain electrode 175 positioned on the oxide semiconductor layer 154. Also included is a first insulating layer 180a positioned on the source electrode 173 and the drain electrode 175 and including a first contact hole 184, a data line 171 positioned on the first insulating layer 180a and intersecting the gate line 121, a second insulating layer 180b positioned on the data line 171 and including a second contact hole 185, and a connection 190 and a pixel electrode 191 positioned on the second insulating layer 180b.

Here, the source electrode 173 and the drain electrode 175 are formed with a metal oxide, and the metal oxide may include at least one of indium, gallium, zinc, tin, and aluminum.

Although the present exemplary embodiment is described as having a bottom gate structure, one of ordinary skill in the art will understand that the present invention may also be applied to a top gate structure.

Again referring to FIG. 13 and FIG. 14, the thin film transistor array panel according to an exemplary embodiment of the present invention will be described.

A thin film transistor array panel according to the present exemplary embodiment includes a substrate 110, a gate line 121 positioned on the substrate and including a gate electrode 124, a gate insulating layer 140 positioned on the gate line 121, an oxide semiconductor layer 154 positioned on the gate insulating layer 140, and a source electrode 173 and a drain electrode 175 positioned on the oxide semiconductor layer 154. Also included is a first insulating layer 180a positioned on the source electrode 173 and the drain electrode 175 and including a first contact hole 184, a data line 171 positioned on the first insulating layer 180a and intersecting the gate line 121, a second insulating layer 180b positioned on the data line 171 and including a second contact hole 185, and a pixel electrode 191 positioned on the second insulating layer 180b.

Here, the data line 171 directly contacts the source electrode 173 in the first contact hole 184. Here, the source electrode 173 and the drain electrode 175 are formed with a metal oxide, and the metal oxide may include at least one of indium, gallium, zinc, tin, and aluminum.

Although the present exemplary embodiment is described as having a bottom gate structure, the present invention may be applied to a top gate structure as well.

According to the described exemplary embodiment of the present invention, the source electrode and the drain electrode are formed substantially entirely of a metal oxide that is the same as or similar to that of the oxide semiconductor layer. This is in contrast to the conventional art in which the source electrode and the drain electrode are formed of a metal material.

Figure 17:
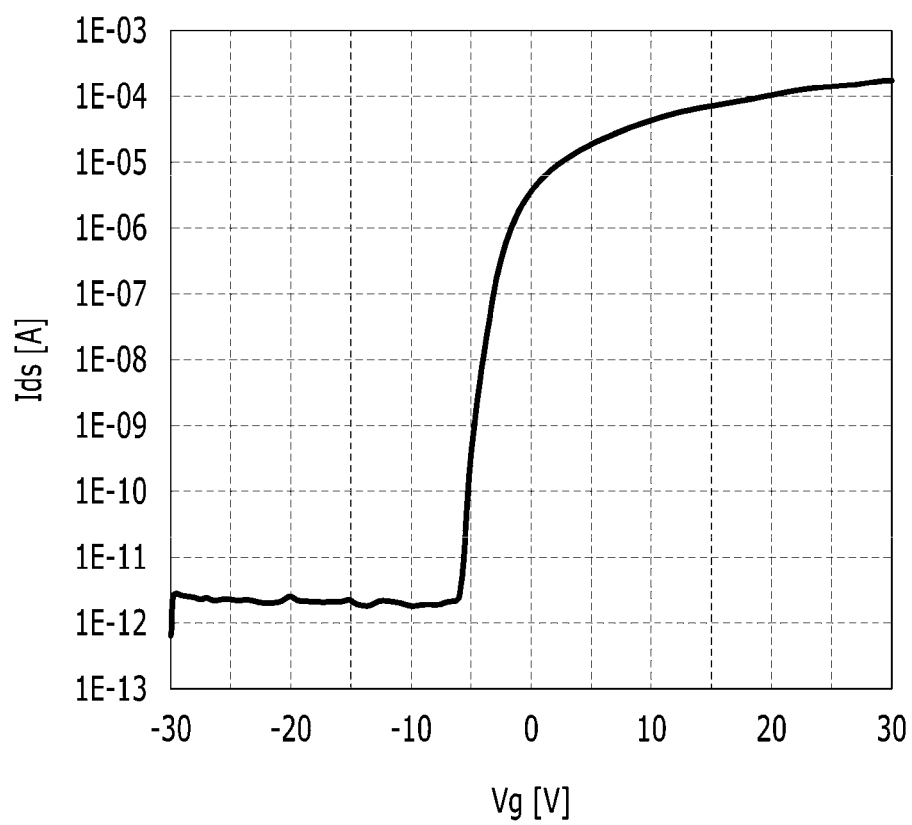
FIG. 17 is a graph showing a characteristic of a thin film transistor according to an exemplary embodiment of the present invention.

In the conventional art, when forming the source electrode and the drain electrode made of the metal such as copper or molybdenum, copper is oxidized in subsequent processes such as the deposition of the insulating layer so that the thin film transistor's electrical characteristics are deteriorated, and the molybdenum layer contacting the oxide semiconductor layer is oxidized such that a short may be generated in the thin film transistor. However, according to an exemplary embodiment of the present invention, if the source electrode and the drain electrode are formed of a metal oxide having similar characteristics to that of the oxide semiconductor layer, the reactivity between the source electrode or the drain electrode and the oxide semiconductor layer is decreased during high temperature heat treatment. FIG. 17 shows test results of the electrical characteristic of a thin film transistor with a source electrode and drain electrode made of a single layer of gallium-zinc oxide as one of the metal oxides.

However, if the data line transmitting the signal is formed of a metal oxide, the resistance of the data line is high. To compensate for this, in the exemplary embodiment of the present invention, the data line and source electrode are formed separately. As described above, the source electrode and the drain electrode are formed of a metal oxide having low reactivity against the oxide semiconductor layer, and the data line transmitting the signal is formed of a metal such as copper or molybdenum, etc. having low resistance.

In this way, the source electrode and the drain electrode are not used as wiring transmitting the signal, such that the overall resistivity is not large. However, it is preferable that the resistance of the thin film transistor is set up in a range such that the wire resistance is within 1% of the resistance of the thin film transistor. It is preferable that the resistance of the thin film transistor is less than about 10,000μΩ. Here, the resistance of the thin film transistor means a resistance between the source electrode and the drain electrode.

Figure 15:
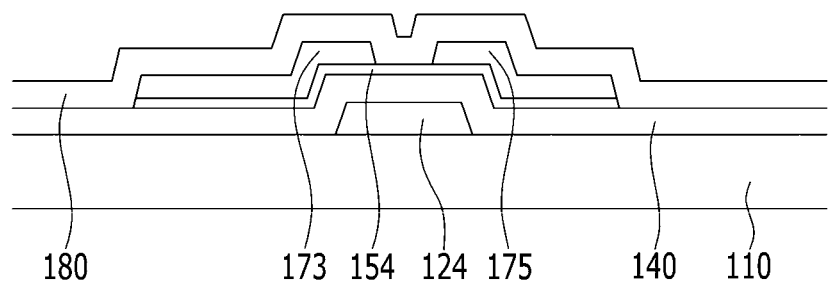
FIG. 15 is a cross-sectional view of a thin film transistor according to an exemplary embodiment of the present invention.

FIG. 15 is a cross-sectional view of a thin film transistor according to an exemplary embodiment of the present invention.

Referring to FIG. 15, a gate electrode 124 is positioned on the substrate 110. The substrate 110 may be made of transparent glass or plastic.

The gate electrode 124 may be made of an aluminum-based metal such as aluminum (Al), an aluminum alloy, and the like, a silver-based metal such as silver (Ag), a silver alloy, and the like, a copper-based metal such as copper (Cu), a copper alloy, and the like, a molybdenum-based metal such as molybdenum (Mo), a molybdenum alloy, and the like, chromium (Cr), titanium (Ti), tantalum (Ta), manganese (Mn), and the like. In this exemplary embodiment, the gate electrode 124 is formed as a single layer electrode, but the invention is not limited thereto, and may be formed as a multilayer structure such as a double layer or a triple layer electrode made of a combination of different layers having different physical properties.

A gate insulating layer 140 is positioned on the gate electrode 124. The gate insulating layer 140 may be made of silicon nitride (SiNx), silicon oxynitride (SiON), or silicon oxide (SiO2) through a sputtering method. The gate insulating layer 140 may be made of a dual layer of silicon oxide and silicon nitride, or silicon oxide and silicon oxynitride.

The semiconductor layer 154 made of an oxide semiconductor is positioned on the gate insulating layer 140. The semiconductor layer 154 includes at least one among zinc (Zn), indium (In), tin (Sn), gallium (Ga), and hafnium (Hf). Particularly, in the present exemplary embodiment, the semiconductor layer 154 may be indium-gallium-zinc oxide.

The source electrode 173 and the drain electrode 175 are positioned on the semiconductor layer 154 to be separated from each other. The source electrode 173 and the drain electrode 175 are both formed of a metal oxide. The metal oxide forming the source electrode 173 and the drain electrode 175 includes at least one of indium, gallium, zinc, tin, and aluminum.

The oxide semiconductor layer 154 includes an exposed portion that is not covered by the source electrode 173 or the drain electrode 175. The exposed portion lies between the source electrode 173 and the drain electrode 175. The oxide semiconductor layer 154 may have substantially the same plane pattern as the source electrode 173 and the drain electrode 175, except for the exposed portion of the oxide semiconductor layer 154.

One gate electrode 124, one source electrode 173, and one drain electrode 175 collectively form one thin film transistor (TFT) along with the corresponding oxide semiconductor layer 154, and the channel of the thin film transistor is formed between the source electrode 173 and the drain electrode 175.

A passivation layer 180 covering the source electrode 173, the drain electrode 175, and the exposed portion of the oxide semiconductor layer 154 is formed on the gate insulating layer 140. The passivation layer 180 is formed of an inorganic insulator such as silicon nitride or silicon oxide, an organic insulator, or a lower dielectric constant insulating material.

Figure 16:
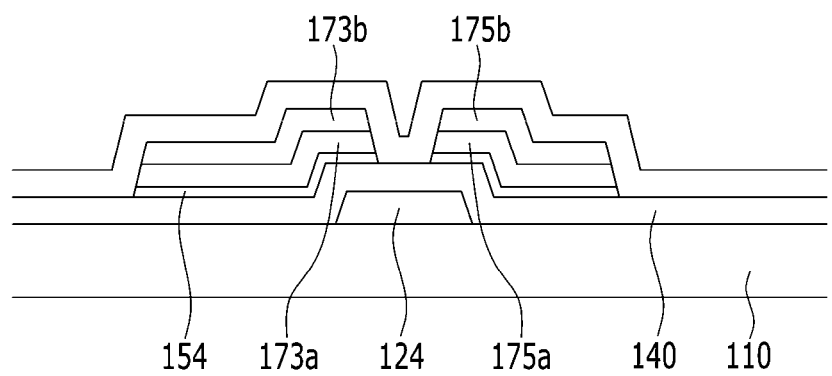
FIG. 16 is a cross-sectional view of a thin film transistor according to an exemplary embodiment of the present invention.

FIG. 16 is a cross-sectional view of a thin film transistor according to an exemplary embodiment of the present invention.

Referring to FIG. 16, the present embodiment is the same as most of the thin film transistor of FIG. 15, however the source electrode 173 and the drain electrode 175 are formed as dual layer structures. The source electrode 173 and the drain electrode 175 may include lower layers 173a and 175a and upper layers 173b and 175b that are respectively formed of metal oxide. The metal oxides of the source electrode 173a and 173b and the drain electrode 175a and 175b include at least one of indium, gallium, zinc, tin, and aluminum.

FIG. 17 is a graph showing a characteristic of a thin film transistor according to an exemplary embodiment of the present invention.

Referring to FIG. 17, for the thin film transistor according to an exemplary embodiment of the present invention, the width of its channel portion is about 30 μm, the length of the channel portion is about 4 μm, and the source electrode and the drain electrode are formed of the metal oxide including gallium-zinc oxide. FIG. 17 shows the result of measuring a drain current value (Id) when the thin film transistor formed as described above is turned on.

Instead of being formed of a metal material like the conventional art, the source electrode and the drain electrode are made of a metal oxide. As a result, a slope value (threshold slope; S·S) after the threshold voltage is very low, and charge mobility is high, with a degree of 9 $cm^2/V \cdot s$.

While aspects of this invention have been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>

| | |
|---|---|
| 110 substrate | 121 gate line |
| 124 gate electrode | 140 gate insulating layer |
| 154 semiconductor layer | 171 data line |
| 173 source electrode | 175 drain electrode |
| 180a first insulating layer | 180b second insulating layer |
| 184 first contact hole | 185 second contact hole |
| 190 connection | 191 pixel electrode |

What is claimed is:

1. A thin film transistor array panel comprising:
a substrate;
a gate line positioned on the substrate and including a gate electrode;
a gate insulating layer positioned on the gate line;
an oxide semiconductor layer positioned on the substrate;
a source electrode and a drain electrode positioned on the oxide semiconductor layer;
a first insulating layer positioned on the source electrode and the drain electrode and including a first contact hole that exposes a portion of the source electrode;
a data line positioned on the first insulating layer and intersecting the gate line; and
a pixel electrode-over the first insulating layer,
wherein the source electrode and the drain electrode—each comprise a metal oxide, and
the data line is electrically connected to the source electrode through the first contact hole.

2. The thin film transistor array panel of claim 1, further comprising:
a second insulating layer positioned on the data line; and
a connection connecting the data line and the source electrode, the connection positioned on the second insulating layer.

3. The thin film transistor array panel of claim 1, wherein:
the data line directly contacts the source electrode in the first contact hole.

4. The thin film transistor array panel of claim 1, wherein:
the source electrode and the drain electrode each contact the oxide semiconductor layer.

5. The thin film transistor array panel of claim 1, wherein:
the source electrode and the drain electrode each comprise a metal oxide including at least one of indium, gallium, zinc, tin, and aluminum.

6. The thin film transistor array panel of claim 1, wherein an upper surface of a portion of the source electrode and the drain electrode overlapping the gate electrode contact the first insulating layer.

7. The thin film transistor array panel of claim 2 wherein:
the connection contacts the data line and the source electrode in the first contact hole.

8. The thin film transistor array panel of claim 7, wherein:
the second insulating layer includes a second contact hole;
the pixel electrode is connected to the drain electrode through the second contact hole; and
the pixel electrode is positioned at the same layer as the connection.

9. The thin film transistor array panel of claim 3, wherein:
the data line includes a protrusion protruding toward the gate electrode, and
the protrusion overlaps the first contact hole.

10. The thin film transistor array panel of claim 9, wherein:
the pixel electrode is connected to the drain electrode through the second contact hole.

11. A thin film transistor comprising:
a substrate;
a gate electrode positioned on the substrate;
a gate insulating layer positioned on the gate electrode;
an oxide semiconductor layer positioned on the substrate;
a source electrode and a drain electrode positioned on the oxide semiconductor layer;
a passivation layer positioned on the source electrode and the drain electrode, the passivation layer having a contact hole that exposes a portion of the source electrode; and
a data line electrically connected to the source electrode through the contact hole,
wherein the source electrode and the drain electrode are formed of a metal oxide.

12. The thin film transistor of claim 11, wherein:
the source electrode and the drain electrode contact the oxide semiconductor layer.

13. The thin film transistor of claim 12, wherein:
the source electrode and the drain electrode comprise a metal oxide including at least one of indium, gallium, zinc, tin, and aluminum.

14. The thin film transistor of claim 13, wherein:
the source electrode and the drain electrode include a lower layer and an upper layer positioned on the lower layer.

15. A thin film transistor comprising:
a gate insulating layer disposed on the substrate;
a gate electrode disposed adjacent to one surface of the gate insulating layer;
an oxide semiconductor layer disposed on the other surface of the gate insulating layer;
a source electrode and a drain electrode electrically connected to the oxide semiconductor layer;
an insulating layer disposed on the source electrode and the drain electrode, the insulating layer having a contact hole exposing the source electrode;
a data line connected to the source electrode through the contact hole.

16. The thin film transistor of claim 15, the data line is directly connected to the source electrode.

17. The thin film transistor of claim 15, the data line is connected to the source electrode via a connection layer, wherein the connecting layer is formed of the same material as a pixel electrode.

18. The thin film transistor of claim 15, wherein the data line is formed of a different material as the source electrode.

19. The thin film transistor of claim 15, wherein the data line is formed on a different plane as the source electrode.

20. The thin film transistor of claim 16, wherein the data line is formed of a different material as the source electrode.

21. The thin film transistor of claim 16, wherein the data line is formed on a different plane as the source electrode.

22. The thin film transistor of claim 20, wherein the data line is formed on a different plane as the source electrode.

23. The thin film transistor of claim 17, wherein the data line is formed of a different material as the source electrode.

24. The thin film transistor of claim 17, wherein the data line is formed on a different plane as the source electrode.

25. The thin film transistor of claim 23, wherein the data line is formed on a different plane as the source electrode.

26. The thin film transistor of claim 18, wherein the data line is formed on a different plane as the source electrode.

* * * * *